(12) United States Patent
Farnworth et al.

(10) Patent No.: US 6,369,597 B2
(45) Date of Patent: Apr. 9, 2002

(54) METHOD AND APPARATUS FOR CAPACITIVELY TESTING A SEMICONDUCTOR DIE

(75) Inventors: Warren M. Farnworth, Nampa; Salman Akram, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/797,795

(22) Filed: Mar. 2, 2001

Related U.S. Application Data

(62) Division of application No. 09/387,649, filed on Sep. 1, 1999, which is a division of application No. 08/944,598, filed on Oct. 6, 1997.

(51) Int. Cl.[7] .............................................. G01R 31/02
(52) U.S. Cl. ...................... 324/755; 324/754; 324/758; 324/765
(58) Field of Search ................................ 324/754, 755, 324/761, 762, 765, 158.1

(56) References Cited

U.S. PATENT DOCUMENTS

| | | | |
|---|---|---|---|
| 5,088,190 A | 2/1992 | Malhi et al. ................. 29/843 |
| 5,326,428 A | 7/1994 | Farnworth et al. .......... 156/654 |
| 5,336,649 A | 8/1994 | Kinsman et al. ............. 437/209 |
| 5,367,253 A | 11/1994 | Wood et al. ............... 324/158.1 |
| 5,408,190 A | 4/1995 | Wood et al. ................. 324/765 |
| 5,419,807 A | 5/1995 | Akram et al. ............. 156/647.1 |
| 5,440,240 A | 8/1995 | Wood et al. ................. 324/765 |
| 5,483,741 A | 1/1996 | Akram et al. ................. 29/846 |
| 5,487,999 A | 1/1996 | Farnworth ..................... 437/7 |
| 5,519,332 A | 5/1996 | Wood et al. ................. 324/755 |
| 5,541,525 A | 7/1996 | Wood et al. ................. 324/755 |
| 5,607,818 A | 3/1997 | Akram et al. ............... 430/311 |
| 5,633,122 A | 5/1997 | Tuttle ......................... 430/317 |
| 5,898,217 A | 4/1999 | Johnston ..................... 257/691 |
| 6,119,255 A | * 9/2000 | Akram ........................ 324/765 |

OTHER PUBLICATIONS

Salzman, David, and Knight, Thomas, Jr., "Capacitive Coupling Solves the Known Good Die Problem," *IEEE*, Jul. 1994, pp. 95–100.

* cited by examiner

*Primary Examiner*—Ernest Karlsen
*Assistant Examiner*—Minh N. Tang
(74) *Attorney, Agent, or Firm*—Dorsey & Whitney LLP

(57) ABSTRACT

An apparatus, process for forming an apparatus, and method for testing a semiconductor die having first and second die terminals. The apparatus includes a substrate having a coefficient of thermal expansion approximately equal to a thermal expansion coefficient of the die. The substrate includes first and second test terminals positioned on a surface of the substrate and positionable proximate to the die. The first test terminal is a conductive portion aligned with and spaced apart from a conductive portion of the first die terminal when the substrate is positioned proximate to the die. The first test terminal is coupleable to a variable power source current to generate a variable signal at the first test terminal and capacitively generate a corresponding signal at the first die terminal. The second test terminal is aligned with the second die terminal when the conductive portion of the first test terminal is aligned with the first die terminal.

24 Claims, 8 Drawing Sheets

METHOD AND APPARATUS FOR CAPACITIVELY TESTING A SEMICONDUCTOR DIE

CROSS-REFERENCE TO RELATED APPLICATION

This application is a Divisional Application of pending U.S. patent application Ser. No. 09/387,649, filed Sep. 1, 1999, which is a Divisional Application of Ser. No. 08/944,598, filed Oct. 6, 1997.

TECHNICAL FIELD

The present invention is directed toward a method and apparatus for capacitively applying a test signal to a semiconductor die.

BACKGROUND OF THE INVENTION

Semiconductor dies form the core of semiconductor modules and other devices which are used extensively throughout the computer industry, telecommunication industry, and myriad related industries. The dies are typically tested during the manufacturing process to ensure that the dies conform to operational specifications. The resulting dies are then installed in the semiconductor module or device.

Semiconductor dies are typically tested by placing conductive test leads in contact with respective bond pads of the die, applying a test signal to the bond pads via the test leads, and determining whether the die responds with the proper output signals. To ensure proper transmission of the test signals to the die, the test leads may be placed in physical contact with the bond pads of the die using a variety of methods. One method is to solder the leads to the bond pads. Another method is to couple the leads to terminals and then force the terminals into engagement with the bond pad, deforming both the terminals and the bond pad. One drawback of the foregoing methods is that they include at least temporarily connecting the leads or terminals to the bond pads prior to testing and then disconnecting the leads or terminals subsequent to testing. Connecting and disconnecting the leads is time consuming and may damage the bond pads, making it difficult to permanently install the die in a semiconductor module when testing has been completed.

One approach to solving the foregoing problem has been to replace the test leads with test pads, which are capacitively coupled to corresponding bond pads of the die. The capacitive coupling is formed by a dielectric layer positioned between an electrically conductive portion of the test pad and the corresponding conductive portion of the bond pad. No direct physical contact is required between the conductive portions of the test pads and the corresponding bond pads. As a result, the likelihood that the bond pads will become damaged by the test pads is reduced. This method may also be less expensive than conductive testing methods because capacitively coupling and decoupling the bond pads and test pads may require less time and effort than conductively connecting and disconnecting the bond pads and test leads.

Conventional methods for capacitively testing a semiconductor die suffer from several drawbacks. The capacitive test pads of a device used to test the die may be large compared to bond pads and may not be aligned with the bond pads. As a result, an interlayer must be placed between the bond pads of the die and the capacitive test pads. Contacts on the surface of the interlayer are aligned with the capacitive test pads of the test device and are connected through the interlayer to the bond pads of the die. Forming the interlayer requires an additional manufacturing step and it may be necessary to remove the interlayer before the die may be permanently installed, requiring yet another manufacturing step.

Another drawback with a conventional method and device used to capacitively test semiconductor dies is that the device has a thermal expansion coefficient which is different than the thermal expansion coefficient of the die material. As a result, when the die is tested at high temperatures, the die and the test device expand at different rates and capacitive coupling may not be maintained between the die and the test apparatus.

Yet another draw back with conventional testing devices is that the capacitive test pads may be flush with the surface of the test device. When the test device is placed adjacent the die for testing, dust particles or other contaminants may become trapped between the test device and the die, damaging the die. Still another drawback of conventional testing methods is that they may require that a liquid or gel dielectric material be placed on the bond pads of the die prior to testing. The liquid or gel dielectric mateial may be difficult to remove after testing, contaminating the die and inhibiting good connections between the bond pads of the die and lead wires which are connected to the bond pads when the die is permanently installed.

SUMMARY OF THE INVENTION

The present invention is a method and apparatus for capacitively testing a semiconductor die or wafer having first and second die terminals. In one embodiment, the apparatus comprises a substrate positionable proximate the die and having a coefficient of thermal expansion approximately equal to a thermal expansion coefficient of the die. The apparatus further comprises first and second test terminals positioned on a surface of the substrate. The first test terminal has a conductive portion aligned with and spaced apart from a conductive portion of the first die terminal. The first test terminal may accordingly be capacitively coupled to the first test terminal when the substrate is positioned proximate to the die. The second test terminal is aligned with the second die terminal when the conductive portion of the first test terminal is aligned with the first die terminal.

In one embodiment of the invention, the apparatus further comprises a dielectric material positioned intermediate the conductive portion of the first test terminal and the conductive portion of the first die terminal. The dielectric material is attached to the conductive portion of the first test terminal in one embodiment and is attached to the first die terminal in another embodiment. In yet another embodiment, the die is one of a plurality of dies comprising a silicon wafer and the substrate is sized and shaped to be positioned adjacent the silicon wafer.

The invention is also directed toward a method for manufacturing an apparatus for capacitively testing a semiconductor die having first and second die terminals, each connector having a conductive surface. The method comprises forming a first test terminal on a substrate such that the first test terminal has a conductive surface aligned with and spaced apart from the conductive surface of the first die terminal. The method further comprises forming a second test terminal on the substrate having a conductive portion aligned with the second die terminal while the first test terminal is aligned with the first die terminal. The method further comprises positioning a dielectric material intermediate at least the conductive portion of the first test terminal and the conductive surface of the first die terminal when the first test terminal is aligned with the first die terminal.

In one embodiment, a method for manufacturing an apparatus in accordance with the invention further comprises applying a layer of photoresist material to a surface of the substrate, exposing a first region of the photoresist material to a selected radiation to form an exposed region of photoresist material, and shielding a second region of the photoresist material from exposure to the selected radiation to form a shielded region of photoresist material. The method further comprises removing one of the exposed and shielded regions, and removing substrate material previously covered by the other of the exposed and shielded regions to form a projection which is aligned with the first die terminal when the substrate is positioned proximate the die.

In yet another embodiment of a method in accordance with the invention, the first test terminal is formed by applying an insulating layer to a surface of the substrate and forming a first portion of conductive material on the insulating layer, the first portion of conductive material being aligned with the first die terminal when the substrate is positioned proximate to the die. The method further comprises forming a second portion of conductive material on the insulating layer aligned with the second die terminal when the first portion of conductive material is aligned with the first die terminal.

DETAILED DESCRIPTION OF THE INVENTION

The present invention is directed toward a method and apparatus for capacitively coupling bond pads or terminals of a semiconductor die directly to the corresponding test terminals of a test apparatus. An aspect of one embodiment of the invention is that the test terminals of the apparatus are aligned with the corresponding die terminals of the die. Accordingly, the die need not be modified in any way to align the terminals thereof with the test terminals of the test apparatus. Another aspect of an embodiment of the invention is that a substrate of the apparatus may comprise material having the same coefficient of thermal expansion as that of the die. Accordingly, when the die is tested with the test apparatus at elevated temperatures, the die terminals remain aligned with the test terminals. FIGS. 1–10B illustrate various embodiments of the apparatus and methods in accordance with the invention, and like reference numbers refer to like parts throughout the various figures.

Figure 1:
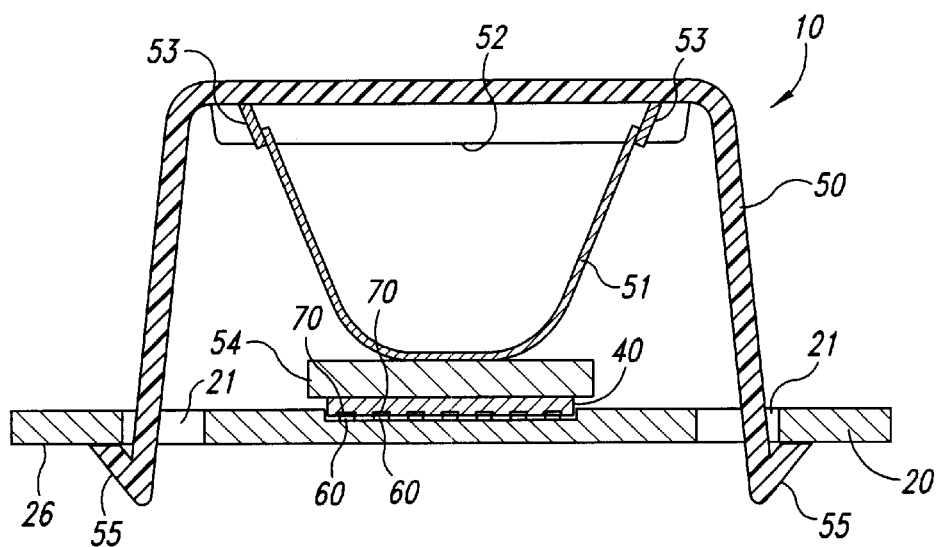
FIG. 1 is a cross-sectional side view of a test apparatus and die in accordance with a first embodiment of the invention.

FIG. 1 is a cross-sectional view of a test apparatus 10 in accordance with an embodiment of the present invention engaging a bare semiconductor die 40. The test apparatus 10 comprises a substrate 20 having test terminals 60 projecting upwardly therefrom. The test terminals 60 are coupled to die terminals 70 of the die 40 to transmit test signals to the die and receive response signals from the die. The response signals are compared with desired response signals to determine whether or not the die conforms with operational specifications.

The test apparatus 10 includes a bridge clamp 50 which urges the die 40 toward the substrate 20. The bridge clamp 50 is removably attached to the substrate 20 by passing mounting tabs 55 of the bridge clamp through slots 21 of the substrate and engaging the mounting tabs with a lower surface 26 of the substrate. The bridge clamp 50 includes internal tabs 53 which engage a spring 51. The spring 51 is bowed downwardly toward the substrate 20 and engages a pressure plate 54 which in turn engages the die 40. The pressure plate 54 uniformly distributes the force supplied by the spring 51 over the surface of the die 40. When the bridge clamp 50 is attached to the substrate 20, the spring 51 urges the pressure plate 54 and die 40 toward the substrate so that the bond pads 70 of the die firmly engage the test terminals 60 projecting upwardly from the substrate. The bridge clamp 50 further includes flanges 52, preferably formed by bending edges of the bridge clamp downwardly. The flanges 52 substantially prevent the bridge clamp 50 from bowing upwardly under the force of the spring 51.

Figure 2:
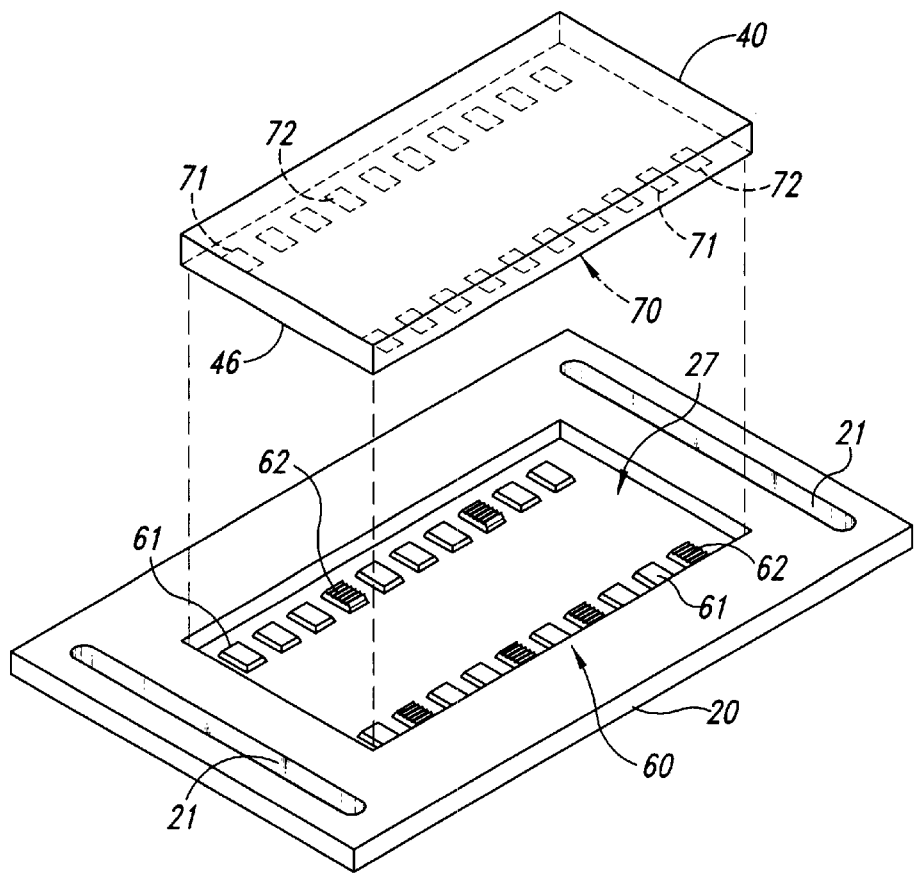
FIG. 2 is an exploded isometric view of a die and a substrate of a test apparatus in accordance with the first embodiment of the invention.

FIG. 2 is an exploded isometric view of the die 40 and the substrate 20 shown in FIG. 1. The die terminals 70 are positioned on a lower surface 46 of the die and may comprise bond pads as shown in FIG. 1, or other structures as discussed below with reference to FIG. 7. The die terminals 70 include constant signal die terminals 72 and variable signal die terminals 71. Both the constant signal die terminals 72 and variable signal die terminals 71 comprise conductive materials. The terms constant signal die terminal and variable signal die terminal are used herein to distinguish die terminals which transmit or receive a constant signal, such as $V_{cc}$ terminals and certain enable terminals, among others, from die terminals which may transmit or receive a variable signal.

The test terminals 60 of the substrate 20 comprise constant signal test terminals 62 and variable signal test terminals 61. The constant signal test terminals 62 are aligned with constant signal die terminals 72 of the die 40 and the variable signal test terminals 61 are aligned with corresponding variable signal die terminals 71. Accordingly, the constant signal test terminals 62 of the test apparatus 10 may be coupled to a source of constant power (not shown) and may engage the constant signal die terminals 72 to form a conductive electrical connection therebetween and transmit a constant signal to the constant signal die terminals. The variable signal test terminals 61 may be coupled to a source of variable power (not shown) and may be capacitively coupled to the variable signal die terminals 71 to transmit a variable signal to the variable signal die terminals.

The test terminals 60 are preferably positioned in a recessed well 27 of the substrate 20 to provide a proper alignment between the test terminals on the substrate and the die terminals 70 on the die 40. The substrate 20 and/or the die 40 may further include visual alignment markings or indentations to further ensure proper alignment between the test animals 60 and the die terminals 70.

Figure 3:
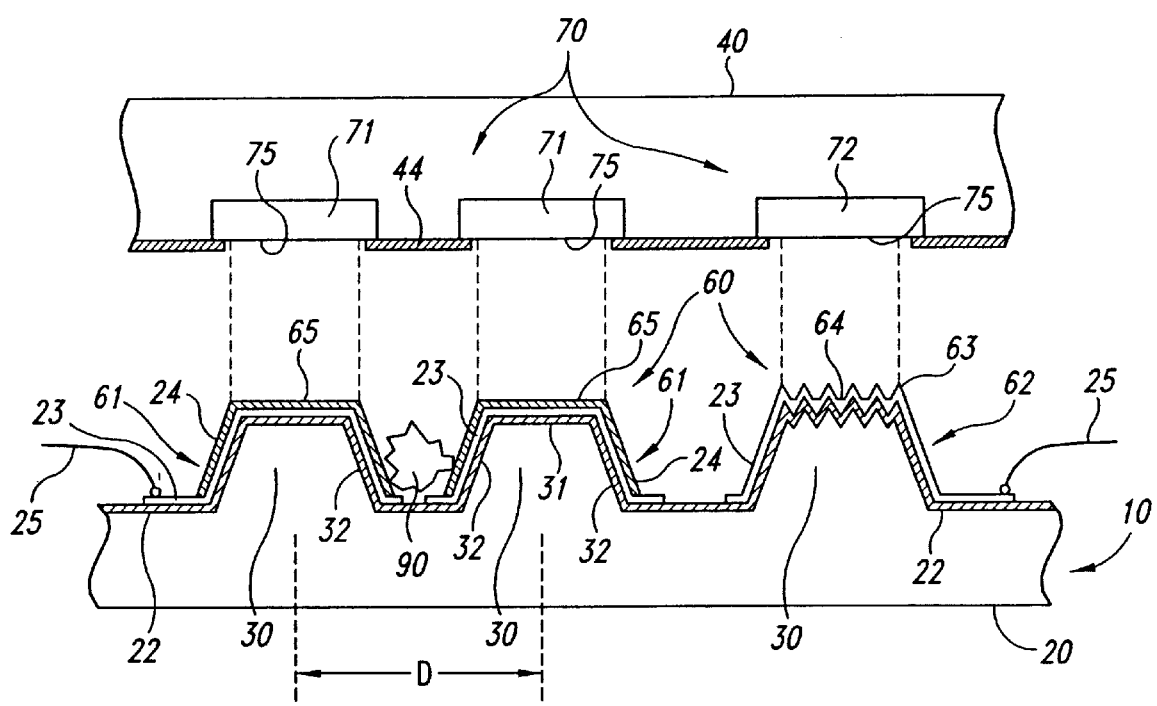
FIG. 3 is an exploded, enlarged cross-sectional view of a portion of the substrate and die shown in FIG. 2.

FIG. 3 is an enlarged cross-sectional view of the substrate 20 and die 40. The substrate 20 includes projections 30 which extend upwardly toward the die 40 and form the cores of the test terminals 60. The projections 30 have a pyramidal shape in a preferred embodiment and may have other shapes in other embodiments. The projections 30 have a center-to-center spacing D which is approximately 0.005 inch to 0.006 inch, corresponding to the spacing between the die terminals 70 of the die 40. In other embodiments, the spacing D may be less than or greater than 0.005 inch to align the projections 30 with bond pads 70 having a correspondingly smaller or larger spacing, respectively.

In a preferred embodiment, the substrate 20 and the projections 30 comprise silicon and the substrate and projections are formed integrally, as will be discussed in greater detail below with respect to FIGS. 4A–4G. Silicon is a preferred material for the substrate 20 because it has the same coefficient of thermal expansion as the silicon comprising the die 40. Accordingly, when the die 40 is tested at varying temperatures, the die and the substrate 20 expand and contract at substantially identical rates so that the die terminals 70 of the die remain aligned with the test terminals 60 of the substrate.

In other embodiments, the substrate 20 may comprise other materials having coefficients of thermal expansion similar to or identical with the thermal expansion coefficient of silicon. Other materials include ceramics, such as Mullite, which is available from Coors Technical Ceramics Co., Oak Ridge, Tenn. In still another embodiment, the substrate 20 may have a thermal expansion coefficient different than that of the die 40. An apparatus 10 in accordance with this embodiment may still be effective when used to test the die 40 at varying temperatures if the die is relatively small, and/or if the die terminals 70 are relatively large so that the test terminals 60 maintain alignment with the die terminals despite the fact that the die 40 and substrate 20 may expand and contract at different rates at the varying temperatures.

In a preferred embodiment, the substrate 20, including the projections 30, is covered with an insulating layer 22 comprising an electrically insulative material. Conductive layers 23 are selectively positioned over the insulating layer 27 to cover each projection 30. The conductive layers 23 are separated from each other as shown in FIG. 3 so that electrical signals may be separately transmitted to or received from each test terminal 60. Bond wires 25, some of which are omitted from FIG. 3 for purposes of clarity, are accordingly connected to each conductive layer 23 to transmit test signals to or from the corresponding test terminals 60.

As shown in FIG. 3, the conductive layers 23 completely cover each projection 30, including an upper surface 31 and side surfaces 32 thereof. In an alternate embodiment, the conductive layers 23 cover the upper surfaces 31 and only one side surface 32 of each projection 30. Accordingly, electromagnetic coupling or "cross talk" between adjacent conductive layers 23 is reduced, reducing the likelihood that electrical signals transmitted to one test terminal 60 will affect signals transmitted to a neighboring test terminal.

The variable signal test terminals 61 each include a dielectric layer 24 covering the conductive layers 23 which prevents direct contact between the conductive layer 23 and the corresponding variable signal die terminals 71 when the die 40 is engaged with the test apparatus 10. The dielectric layer 24 may comprise any number of dielectric materials which include but are not limited to nitrides, barium strontium titanate, or oxides, such as tantalum pentoxide. The composition and thickness of the dielectric layer 24 is selected to provide a desired capacitance between the variable signal test terminals 61 and the variable signal die terminals 71. The dielectric 24 defines a contact surface 65 at an upper end of the variable signal test terminal 61 which is sized to engage a contact surface 75 of the corresponding variable signal die terminal 71. Where the die 40 includes a passivation layer 44, which may extend partially over the die terminals 70, the contact surface 65 of each variable signal test terminal 61 is preferably sized to engage the contact surface 75 of the corresponding variable signal die terminal 71 without resting on the passivation layer, substantially eliminating any gap between the contact surfaces 65 and 75. Accordingly, the dielectric constant between each variable signal test terminal 61 and corresponding variable signal die terminal 71 is determined by the composition and thickness of the dielectric layer 24 and not by a gap which might otherwise be formed between the variable signal test terminal and the variable signal die terminal.

In a preferred embodiment, the contact surface 65 is elevated above the substrate 20 by a distance that is greater than the thickness of the passivation layer 44 to ensure that the contact surface 65 of the test terminal engages the contact surface 75 of the variable signal die terminal 71. In a further preferred embodiment, the contact surface 65 is elevated a sufficient distance above the substrate 20 that small particles 90, which may comprise dust or other contaminates and which may be present between the test terminals 60, do not engage and potentially damage the die 40.

As shown in FIG. 3, each constant signal test terminal 62 includes an insulating layer 22 and conductive layer 23 but does not include a dielectric layer. Accordingly, the conductive layers 23 of the constant signal test terminals 62 firmly engage with the corresponding constant signal die terminals 72 to provide electrical connections therebetween. To further ensure proper engagement between the constant signal test terminals 62 and the constant signal die terminals 72, the constant signal test terminals are provided with serrations 63 positioned to engage the constant signal die terminals. The serrations 63 releasably penetrate the contact surface 75 of the constant signal die terminals 72 and are separated by stop surfaces 64 to prevent the serrations from penetrating too deeply into the constant signal die terminals.

In a preferred embodiment, the stop surfaces 64 are positioned such that the serrations 63 penetrate one-half the thickness of the constant signal die terminals 72. In a further preferred aspect of this embodiment, the stop surfaces 64 are aligned with the contact surfaces 65 of the variable signal test terminals 61. Accordingly, when the stop surfaces 64 prevent further penetration by the serrations 63 into the constant signal die terminals 72, the contact surfaces 65 of the variable signal test terminals 61 engage the contact surfaces 75 of the corresponding variable signal die terminals 71. By aligning the contact surfaces 65 with the stop surfaces 64, the die 40 will rest solidly on the test terminals 60 to more reliably transmit electrical signals between the die and the test apparatus 10.

In operation, the test apparatus 10 is used to test the die 40 by placing the die in the recessed well 27 of the substrate 20 as shown in FIG. 2. The user than aligns the variable signal test terminals 61 of the test apparatus 10 with the corresponding variable signal die terminals 71 of the die 40, and aligns the constant signal test terminals 62 with the corresponding constant signal die terminals 72 as shown in FIGS. 2 and 3. The die 40 is firmly engaged with the test apparatus 10 by first placing the pressure plate 54 on the die and then clamping the pressure plate and the die against the substrate 20 by inserting the mounting tabs 55 of the bridge clamp 50 through the slots 21 of the substrate, as shown in FIG. 1.

Constant signals are then applied to the bond lines 25 connected to the constant signal test terminals 62 and variable signals are applied to the bond lines connected to the variable signal test terminals 61. When a varying signal is applied to the variable signal test terminals 61, the signal is capacitively coupled to the corresponding variable signal die terminal 71. The varying current may take the form of a single pulse, an alternating current signal, or any other variable current signal. The response signals received from the die 40 may then be used to determine whether or not the die complies with operational specifications and accordingly qualifies as a good die. It will be understood that any one variable signal test terminal 61 may transmit or receive test signals, depending on the characteristics of the particular die terminal 71 with which it is engaged, and upon the particular phase of the test process.

One advantage of the method and apparatus shown in FIGS. 1–3 is that the test apparatus 10 may be used to test the die 40 capacitively coupling test terminals 61 of the apparatus to variable signal die terminals 71 of the die 40, and by supplying a variable current signal to the capacitive bond pads to test the performance of the die. Conductive connections between the test apparatus 10 and die 40 are used only where the die requires a constant signal. Accordingly, the number of conductive connections between the test apparatus and die, which may physically damage the die terminals, is reduced.

A further advantage of the test apparatus and method shown in FIGS. 1–3 is that the variable signal test terminals 61 of the test apparatus 10 are aligned with the corresponding variable signal die terminals 71 of the bare die 40 when the die is engaged with the test apparatus. The alignment is maintained even where the center-to-center spacing between the die terminals is on the order of 0.005 inch to 0.006 inch, or less. Accordingly, a user need not manipulate the die 40 in any way to align the variable signal die terminals 71 of the die with the variable signal test terminals 61 of the test apparatus 10. Unlike conventional methods, the user need not add to the die 40 a layer which includes intermediate terminals which are electrically connected to the die terminals 70, but spaced to correspond to the locations of the variable signal test pads of a test device. As a result, testing of the bare die 40 is considerably simplified.

Yet a further advantage is that the substrate 20 shown in FIGS. 1–3 may comprise a material having a coefficient of thermal expansion similar to or identical with the thermal expansion coefficient of the die 40. Accordingly, the test apparatus 10 may be used to test the die 40 at varying temperatures while maintaining alignment between the die terminals 70 of the die 40 and the test terminals 60 of the test apparatus.

Still a further advantage of an embodiment of a test apparatus 10 is that the nature of the capacitive coupling between the test apparatus 10 and the die 40 may be controlled by controlling the thickness and/or composition of the dielectric layer 24. The user accordingly has greater control over the capacitance between the test apparatus 10 and the die 40 by manipulating two variables. Furthermore, unlike conventional methods, controlling the dielectric constant between the die 40 and the test apparatus 10 requires only manipulating the test apparatus and not the die itself. Unlike conventional methods, which may require that a dielectric liquid or gel be placed on the variable signal die terminals, the test apparatus 10 requires no contamination of the variable signal die terminals, which may be difficult to remove after testing has been completed.

Figure 4A:
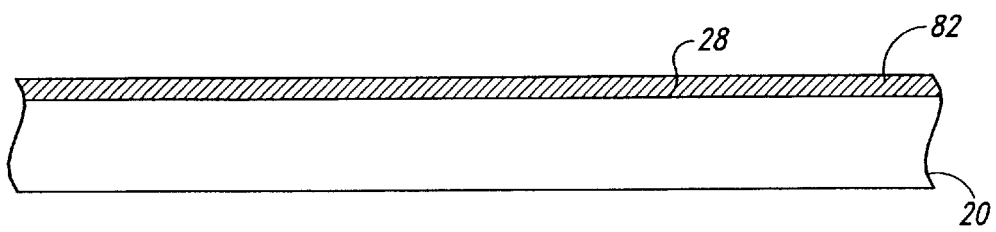
FIGS. 4A–4G are schematic cross-sectional views illustrating a method of forming a test apparatus in accordance with an embodiment of the invention.
Figure 4B:
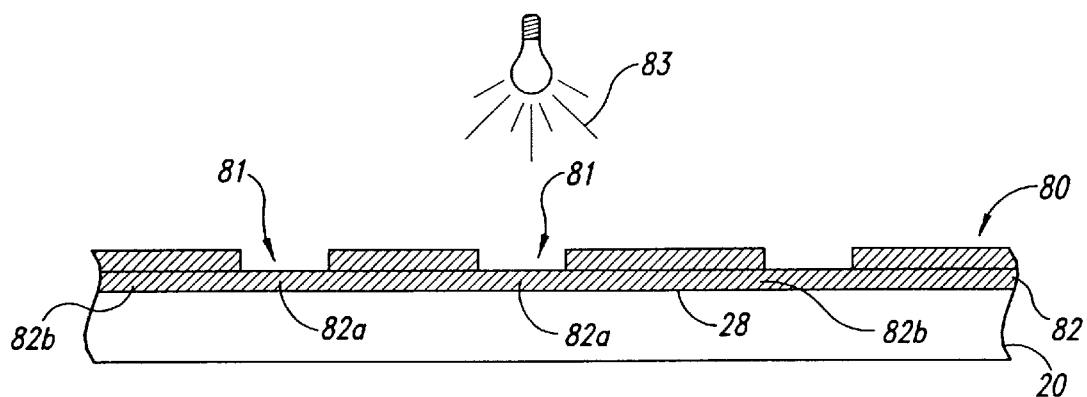

A method for fabricating an apparatus 10 having variable signal test terminals 61 in accordance with an embodiment of the invention is shown in FIGS. 4A–4G. As shown in FIG. 4A, the method includes providing a substrate 20 having a substantially flat upper surface 28. In a preferred embodiment, the substrate 20 may comprise silicon, and may comprise other materials in other embodiments, as discussed below. The upper surface 28 of the substrate 20 is coated with a layer of positive or negative photoresist material 82. As shown in FIG. 4B, a mask 80 is then placed upon the photoresist material 82. The mask 80 may preferably be an exact or nearly exact mirror image of a mask used to form the die terminals 70 on the die 40. Accordingly, the test terminals 60 formed by the mask 80 will have locations corresponding exactly or nearly exactly with the locations of the die terminals 70 when the die 40 is placed face down on the substrate 20.

Where the photoresist material 82 is a positive photoresist material, the mask 80 have apertures 81 which correspond to the locations of the die terminals 70 of the die 40. Where the photoresist material 82 is a negative photoresist material, the apertures 81 correspond to the regions between the die terminals 70. For purposes of illustration, the photoresist material 82 is shown as being positive in FIGS. 4A–4G.

Figure 4C:
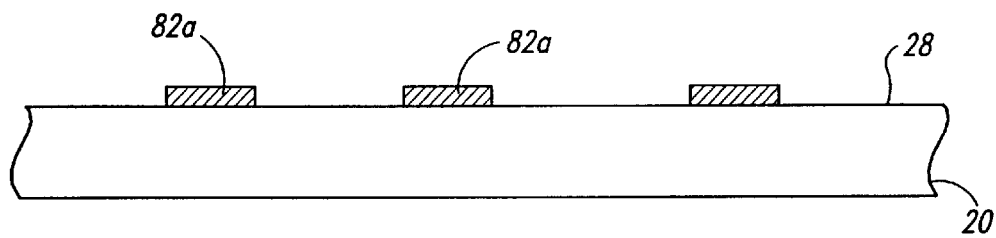

The substrate 20 with photoresist material 82 and mask 80 in place, is exposed to a selected radiation 83 which hardens the photoresist material 82a located beneath the apertures 81 while leaving the photoresist material 82b beneath the mask 80 in a nonhardened state. It will be understood that where a negative photoresist material is used, the photo resist material 82b is hardened while the photoresist material 82a remains in a non-hardened state. After exposure to the selected radiation 83, the mask 80 is removed and the photoresist material 82 rinsed in a chemical bath, which washes away the unhardened photoresist material 82b while leaving the hardened photoresist material 82a in place, as shown in FIG. 4C.

Figure 4D:
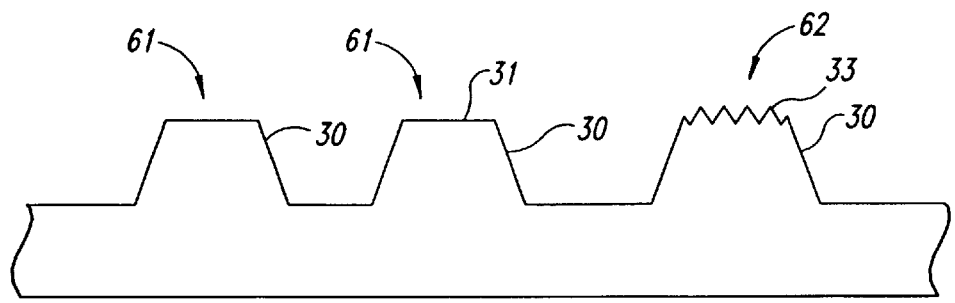

The substrate 20, with the hardened photoresist material 82a in place, is then exposed to an etching solution which anisotropically etches away portions of the substrate not covered by the photoresist material 82a and creates the projections 30 as shown in FIG. 4D. The hardened photoresist material 82a is the removed. Alternatively, the substrate 20 may be exposed to an oxidizing agent which oxidizes the surface of the substrate not covered by the photoresist material 82a. The oxidized portion may then be stripped leaving the projections 30 in place.

In an alternate method of manufacture, the projections 30 may be formed by depositing material on the upper surface 28 of the substrate 20. In one such embodiment, the photoresist layer 82 is eliminated and the mask 80 is placed directly on the substrate 20. Material comprising the projections 30 is then deposited using an overhead ion deposition apparatus or similar device to build the projections up from the upper surface 28 of the substrate 20. Such an alternate method may be used where the substrate 20 comprises a ceramic or other material which may not be as conducive as silicon to etching. The resulting projections 30 may be planarized using chemical-mechanical planarization to flatten the upper surfaces 31 of the projections 30. The flattened upper surfaces 31 accordingly provide the foundation for test terminals 61 having flat contact surfaces 65 which mate well with the corresponding flat contact surfaces 75 of the variable signal die terminals 71 (FIGS. 3).

Ridges 33 may be formed on the projects 30 which will form constant signal test terminals 62. The ridges may be formed using photoresist and etching techniques similar to those discussed above and described in greater detail in U.S. Pat. No. 5,483,741 to Akram et al. and U.S. Pat. No. 5,326,428 to Farnworth et al., both of which are incorporated herein by reference.

Figure 4E:
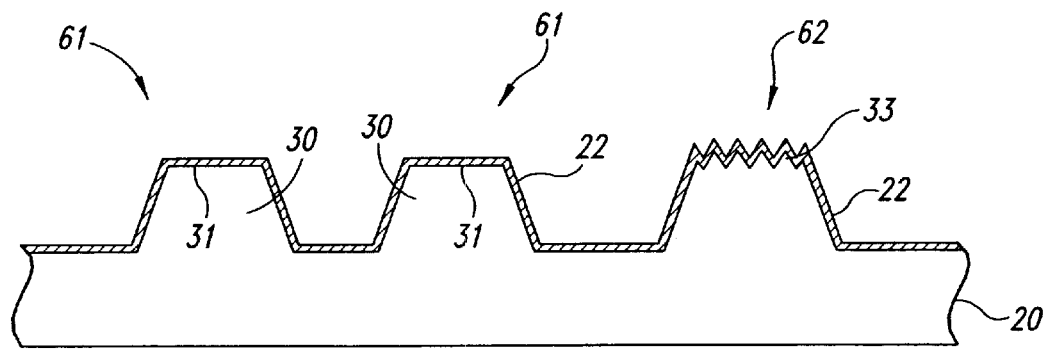

The insulating layer 22 is formed on the projections 30, as shown in FIG. 4E. In one method of manufacture, in which the substrate 20 comprises silicon, the substrate is exposed to an oxidizing atmosphere to form a layer of silicon dioxide $(SiO)_2$, an electrically insulative compound. In alternate embodiments, $SiO_2$ or $Si_3N_4$ may be deposited on the surface of the substrate 20 by chemical vapor deposition. In yet another alternate embodiment, tetraethylorthosilane (TEOS) is injected at high temperature into a chamber surrounding the substrate 20 to grow in insulating layer 22 of $SiO_2$ on the substrate 20. In still another alternate embodiment, the insulating layer 22 is deposited on the substrate 20 by chemical vapor deposition or similar deposition techniques. Such an alternate embodiment may be used where the substrate 20 comprises a ceramic material which does not oxidize as readily as does silicon.

Figure 4F:
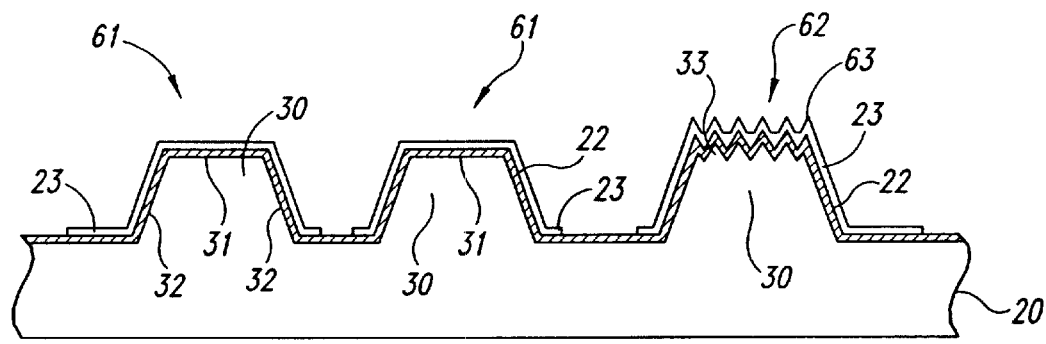

The conductive layers 23 comprising a conductive material are formed atop the insulating layer 22, as shown in FIG. 4F. In one embodiment, an initially continuous conductive layer 23 may be deposited on the insulating layer 22 using chemical vapor deposition. A photoresist and masking process, similar to that discussed above with reference to FIGS. 4A–4D, may then be used to etch away portions of the conductive layer 23 located between the projections 30 to form individual conductive paths to each projection. As discussed previously with reference to FIG. 3, the conductive layers 23 may be etched to cover the entirety of each projection 30, or may be etched to cover the upper surface 31 of each projection and enough of a side surface 32 to form a conductive path to the projection.

The conductive layer 23 and insulating layer 22 conform to the ridges 33 of the constant signal test terminal 62, forming the serrations 63. The serrations 63 may be further roughened by using an electroplating process and controlling the composition of the electrolyte solution used in the process to form a textured or roughened surface which amplifies the serrated surface created by the etching process. The formation of roughened electroplated surfaces is further discussed in U.S. Pat. No. 5,487,999 to Farnworth, incorporated herein by reference.

Figure 4G:
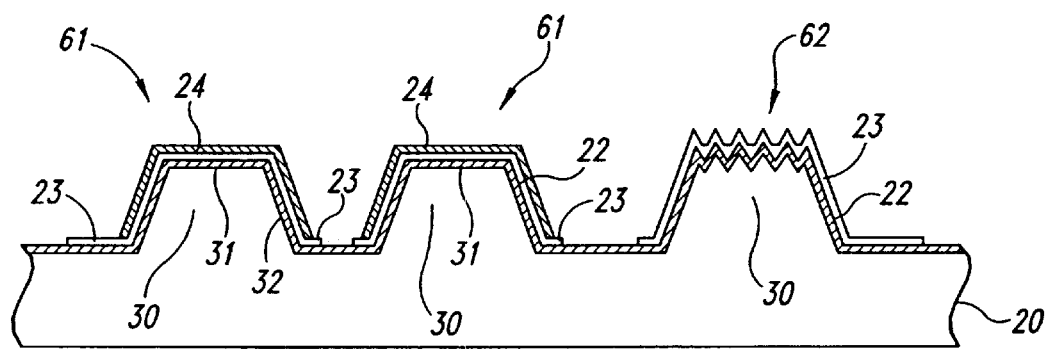

The dielectric layers 24 are formed on the conductive layers 23 of the variable signal test terminals 61, as shown in FIG 4G. In one embodiment, an initially continuous dielectric layer 24 is deposited on the conductive layer 23 by chemical vapor deposition. In another embodiment, the initially continuous dielectric layer 24 may be deposited using an electrophoretic process to form an even layer of dielectric over the projections 30. An electrophoretic process is described in U.S. Pat. No. 5,607,818 to Akram et al., which is incorporated herein by reference. The electrophoretic process includes charging the conductive layer 23, either positively or negatively, and imparting the opposite charge to the dielectric material. The dielectric material is accordingly attracted to the conductive layer 23 and gradually builds up the dielectric layer 24 thereon. An advantage of the electrophoretic process is that it results in an even coating of dielectric material over the conductive layer 23 notwithstanding the non-uniform topography created by the projections 30. Another advantage is that the electrophoretic process is self-limiting because of the conductive layer 23 becomes coated with dielectric material, it tends to have less affinity for additional dielectric material. Accordingly, the amount of dielectric material electrophoretically deposited on the conductive layer 23 may be controlled by controlling the charge applied to the conductive layer. Furthermore, the dielectric layer tends to be thicker at higher temperatures than at lower temperatures. Accordingly, the temperature at which the electrophoretic process is carried out may be used to further control the dielectric characteristics of the dielectric layer 24.

Once a continuous dielectric layer 24 has been formed, portions of the dielectric layer may then be etched away using a photoresist and masking process similar to the process discussed above with reference to FIG. 4A–4D. Dielectric material located between the projections 30 may be removed as shown in FIG. 4G to isolate the variable signal test terminals 61 from each other. In addition, any dielectric material covering the constant signal test terminals 62 may be removed to ensure proper electrical contact between the constant signal test terminals and the corresponding constant signal die terminals 72.

An advantage of the process discussed above with reference to FIGS. 4A–4G is that the process uses a mask layer 80 which is a mirror image of the mask layer used to create the die terminals 70 on the bare die 40. Accordingly, the projections 30 which form the test terminals 60 of the test apparatus 10 may be precisely aligned with the corresponding die terminals 70 of the bare die 40. As a result, the need to form an interlayer between the die 40 and the test apparatus 10 is eliminated, as discussed above with reference to FIGS. 1–3. A further advantage of the process shown in FIGS. 4A–4G is that the dielectric layer 24 is formed on the test apparatus 10, eliminating the need to removably apply liquid or gel dielectric substances to the die 40, as was also discussed above with reference to FIGS. 1–3.

Figure 5:
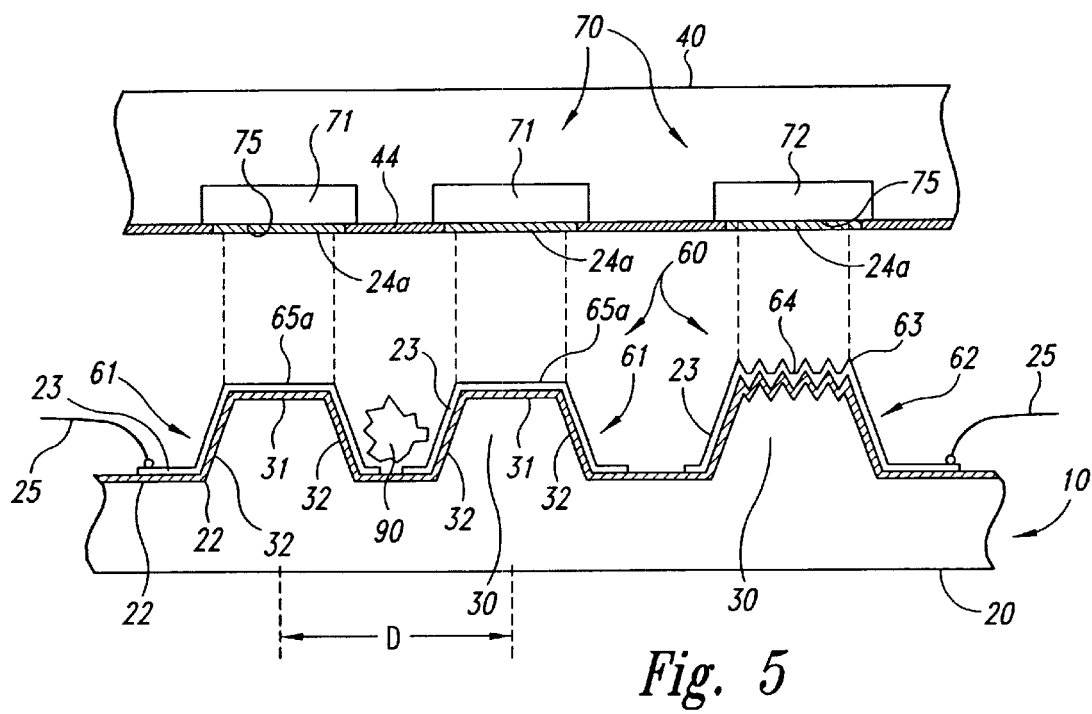
FIG. 5 is an exploded, cross-sectional view of a portion of a test apparatus in accordance with a second embodiment of the invention and a die having a dielectric layer overlaying the bond pads thereof.

FIG. 5 is an exploded, cross-sectional view of a test apparatus 10 in accordance with a second embodiment of the invention, and a die 40 having dielectric layers 24a attached to the variable signal die terminals 71 thereof. In one embodiment, the dielectric layers 24a may comprise oxide coatings which form naturally on the metallic die terminals 70. In other embodiments, the dielectric layers 24a may comprise other organic dielectric materials which may be deliberately formed on the variable signal die terminals 71.

In the embodiment shown in FIG. 5, the dielectric layers 24 are eliminated from the variable signal test terminals 61 of the test apparatus 10 because their function is performed by the dielectric layers 24a on the variable signal die terminals 71. Accordingly, the contact surfaces 65a of the variable signal test terminals 61 comprise a portion of the conductive layer 23 as shown in FIG. 5, rather than a portion of the dielectric layer 24 as shown in FIG. 3.

In one embodiment, the serrations 63 of the constant signal test terminals are capable of penetrating the dielectric layer 24a formed on the constant signal die terminal 72. The serrations accordingly form a conductive connection with the constant signal die terminal 72 notwithstanding the presence of the dielectric material. In another embodiment, the dielectric layers 24a may be prevented from forming on the constant signal die terminals 72 so that the constant signal test terminals 62 form solid conductive contacts with the constant signal die terminals. In still another embodiment, the dielectric layers 24a may be removed from the constant signal die terminals 72 by using masking and etching process, as discussed previously with reference to FIGS. 4A–4D.

An advantage of an embodiment of the test apparatus shown in FIG. 5 is that the test apparatus requires no dielectric layer 24. Accordingly, at least one process step required to form the test apparatus 10 may be eliminated. Conversely, an advantage of an embodiment of the test apparatus shown in FIGS. 1–3 is that the die 40 need not be manipulated to either form or remove the dielectric layer.

Figure 6:
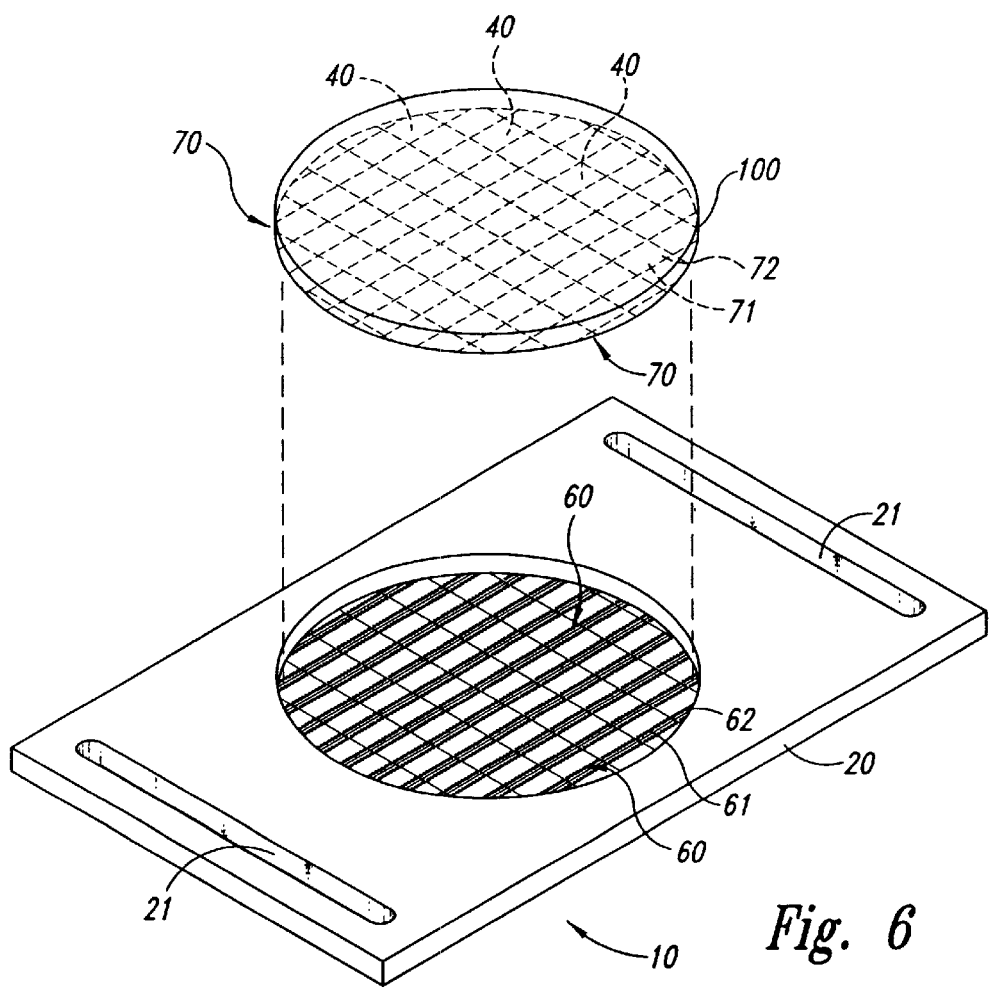
FIG. 6 is an exploded isometric view of a substrate of a test apparatus in accordance with a third embodiment of the invention and a semiconductor wafer.

As discussed above, the dielectric oxide layers may form naturally on the dies 40. The oxide layers may form after the dies have been electrically partitioned from each other on a silicon wafer but remain in a wafer form. To take advantage of the naturally occurring dielectric layers, a test apparatus 10 in accordance with a third embodiment of the invention is sized to accommodate and test an entire wafer 100 comprising a plurality of partitioned dies 40, as shown in FIG. 6. The test apparatus 10 comprises a substrate 20 having slots 21 to accommodate a bridge clamp. (not shown). The bridge clamp is used to releasably couple the wafer 100 to the substrate 20, as discussed previously with reference to FIG. 1. The substrate 20 comprises test terminals 60, which are aligned with corresponding die terminals 70 at the wafer 100. Accordingly, variable signal test terminals 61 are aligned with variable signal die terminals 71 and constant signal test terminals 62 are aligned with constant signal die terminals 72, as discussed previously with reference to FIGS. 1–3.

An advantage of the test apparatus 10 shown in FIG. 6 is that it permits a user to engage the test apparatus with an entire wafer 100 of dies 40 in one operation. Accordingly, the user need not individually engage each die 40 with the test apparatus 10 before testing and then remove each die after testing. A further advantage is that the test apparatus 10 shown in FIG. 6 may use the oxide layer naturally forming on the dies 40 of the wafer 100 to act as dielectric layers between the die terminals 70 of the dies and the test terminals 60 of the test apparatus, reducing the number of processing steps required to produce the test apparatus 10, as discussed above with reference to FIG. 5.

Figure 7:
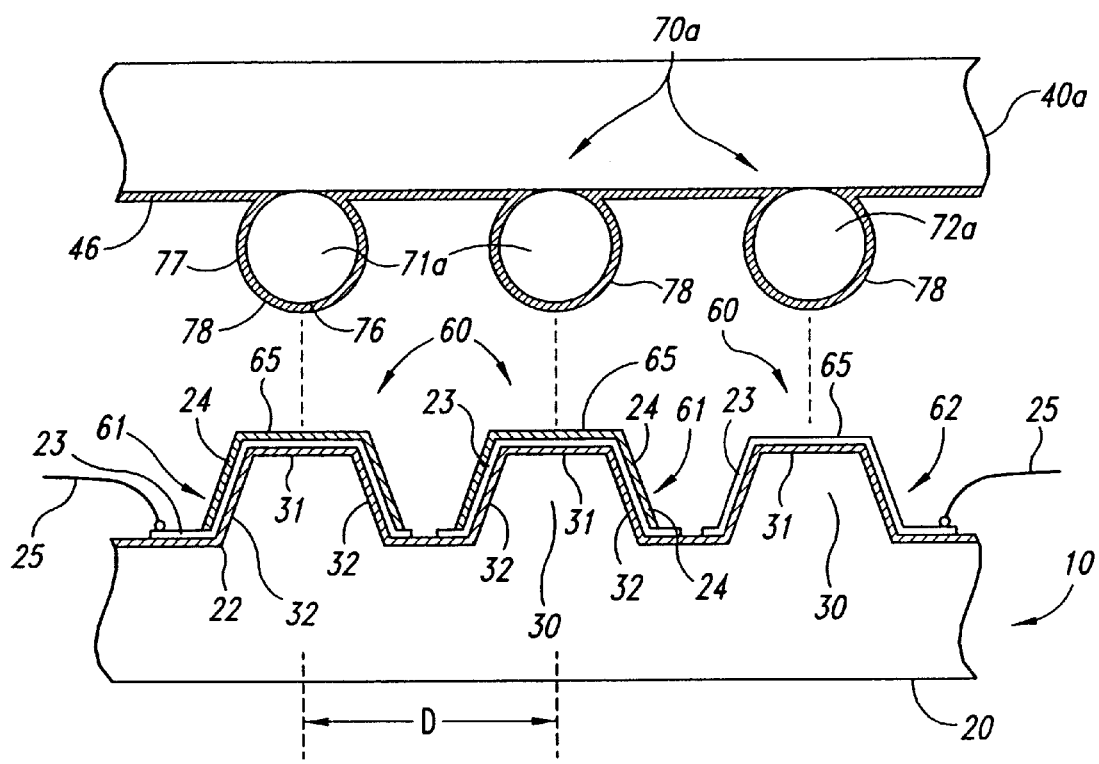
FIG. 7 is an exploded, cross-sectional view of a portion of a test apparatus in accordance with a fourth embodiment of the invention and a flip chip.

FIG. 7 is an exploded, cross-sectional view of a test apparatus 10 in accordance with a fourth embodiment of the invention positioned adjacent a flip chip 40a in FIG. 7. As shown in FIG. 7, the die terminals 70a of the flip chip 40a include a variable signal die terminals 71a and constant signal die terminals 72a. The die terminals 72a may comprise solder balls formed from lead or a similar soft, conductive material. Each die terminal 70a has an end surface 76 spaced apart from the lower surface 46 of the flip chip 40a and a side surfaces 77 intermediate the end surface and the lower surface of the flip chip. The die terminals 70a may have an oxide coating 78 which covers the bond pads and deforms when the flip chip 40a is engaged with the substrate 20. The oxide coating 78 generally deforms sufficiently to create a conductive electrical connection between the die terminals 70a and the test terminals 60 against which they press. Accordingly, the oxide coating 78 is not relied upon to form a dielectric layer between the variable signal die terminals 71a and the variable signal test terminals 61 as was discussed above with reference to FIG. 5. Instead, the dielectric layer 24, positioned on the variable signal test terminals 61, provides the capacitive coupling between the test apparatus 10 and the flip chip 40a, substantially as discussed above with reference to FIGS. 1–3. Furthermore, because the oxide layer 78 deforms when the flip chip 40a is pressed into engagement with the substrate 20, the contact between the constant signal test terminal 62 and the constant signal die terminal 72a is sufficient to create a constant signal connection therebetween, as discussed above. The need for serrations on the conductive test terminals 62 is accordingly eliminated.

Figure 8:
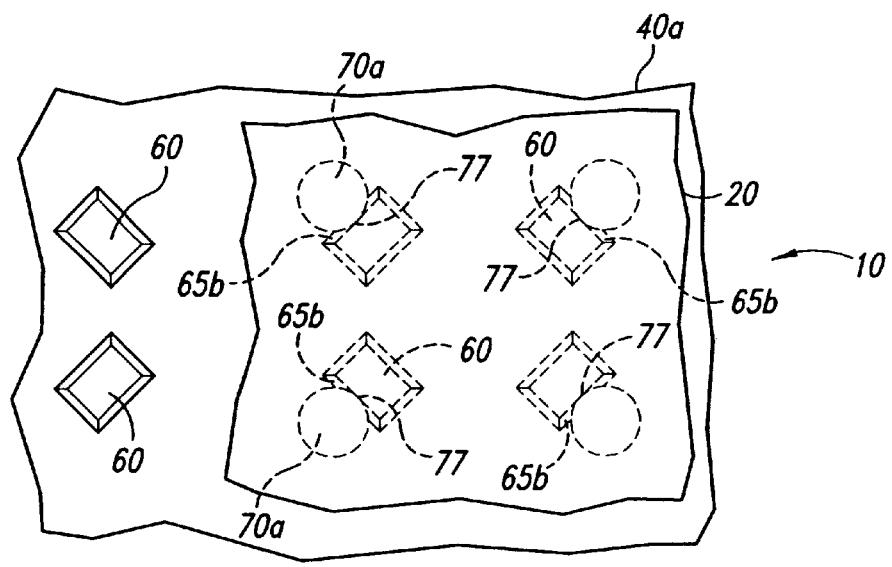
FIG. 8 is a top plan view of a portion of a test apparatus and die in accordance with a fifth embodiment of the invention.

FIG. 8 is a top plan view of a portion of a test apparatus 10 in accordance with a fifth embodiment of the invention shown engaging a portion of a flip chip 40a. The test apparatus 10 shown in FIG. 8 is similar to the apparatus shown in FIG. 7 except that the contact surfaces 65b of the test terminals 60 are positioned parallel to the side surfaces 32 rather than the upper surfaces 31 of the projections 30 (FIG. 7). Accordingly, the side surfaces 77 of the die terminals 70 slide along the contact surfaces 65b of the test terminals 60 as the flip chip 40a is pressed into engagement with the substrate 20.

As shown in FIG. 8, pairs of test terminals 60 having diagonally opposed contact surfaces 65b may be oriented in an alternating pattern to substantially prevent lateral motion of the flip chip 40a relative to the substrate 20 once the die terminals 70a have been engaged with the test terminals 60. The test terminals 60 accordingly aid the user in orienting the flip chip 40a relative to the substrate 20 and maintain the orientation until the die is deliberately disengaged from the test apparatus 10.

Figure 9:
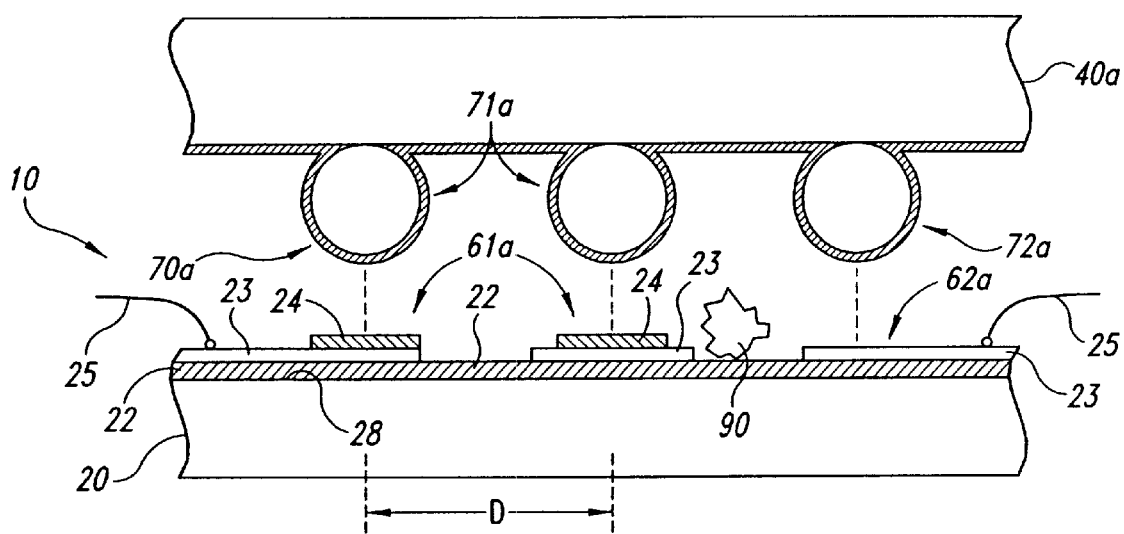
FIG. 9 is an exploded, cross-sectional view of a portion of a test apparatus in accordance with a sixth embodiment of the invention and a flip chip.

FIG. 9 is an exploded, cross-sectional view of a portion of a test apparatus 10 in accordance with a sixth embodiment of the invention. The test apparatus 10 comprises a substrate 20 without large projections 30. Instead, the insulating layer 22, conductive layers 23, and dielectric layers 24 are consecutively formed directly on the upper surface 28 of the substrate to form variable signal test terminals 61a and constant signal test terminals 62a. In the embodiment shown in FIG. 9, the projections 30 are not necessary to provide an offset between the substrate 20 and the flip chip 40a. Instead, the solder balls of the flip chip 40a provide a sufficient offset between the substrate 20 and the flip chip 40a to prevent dust particles or other contaminants 90 from becoming clamped therebetween. An advantage of an embodiment of the test apparatus 10 shown in FIG. 9 is that the process steps required to form raised projections may be eliminated, simplifying the manufacture of the test apparatus 10.

Figure 10A:
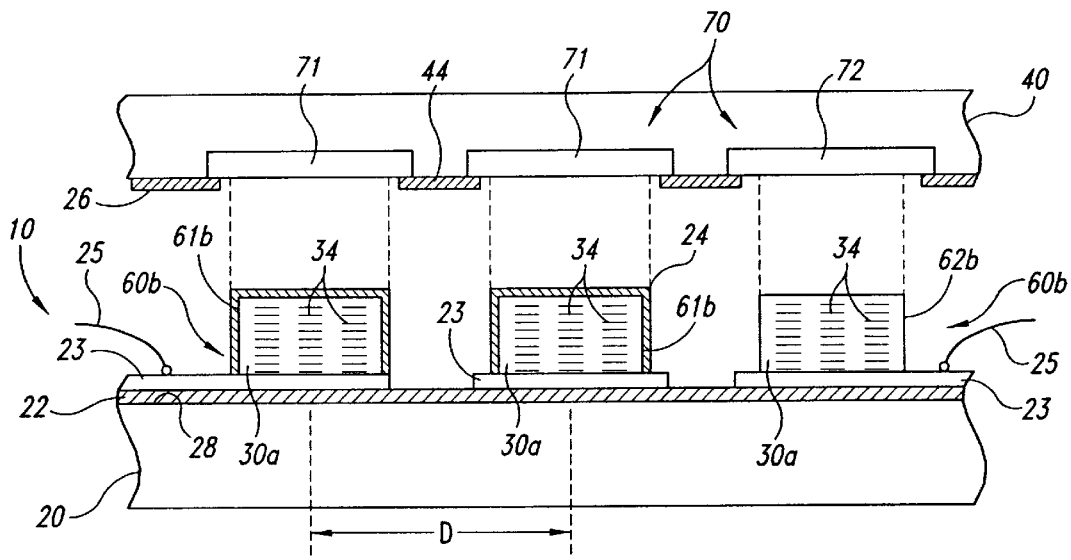
FIG. 10A is an exploded, cross-sectional view of a portion of a test apparatus in accordance with a seventh embodiment of the invention having compressible test terminals in non-compressed state.

FIG. 10A is an exploded, cross-sectional view of a portion of a test apparatus 10 in accordance with a seventh embodiment of the invention having compressible test terminals 60b. The substrate 20 includes an insulating layer 22 and conductive layers 23 formed directly thereon. The projections 30a are formed atop the conductive layers 23 in a subsequent step. The projections 30a comprise a conductive material which may be sputtered or spun on the conductive layers 23 or may be deposited on the conductive layers using chemical vapor deposition. The resulting continuous layer may then be etched using the photoresist and masking techniques discussed previously with reference to FIGS. 4A–4G to form individual projections 30a.

In one embodiment, the projection 30a may be formed from an incompressible conduction material. In another embodiment, the projections 30a may be formed from a compressible, conductive material such as a z-axis elastomer. Such elastomers are available from Zymet of East Hannover, N.J. The elastomer contains conductive particles 34 which are dispersed therethrough and are shown schematically in FIG. 10A. When the elastomer is compressed in a direction normal to the upper surface 28 of the substrate 20, the particles 34 come into contact with each other and create a conductive path through the elastomer.

Dielectric layers 24 are then applied atop the conductive layers 23 of the variable signal test terminals 61b. The dielectric layers 24 preferably comprise a flexible material, such as a polyamide, which will flex as the projections 30a compress. The polyamide may be applied using a spray process or an electrophoretic process, such as was discussed previously with reference to FIG. 4G. As discussed previously with reference to FIG. 3, no dielectric layer is applied to the constant signal test terminals 62b, so as to provide conductive connections between the constant signal test terminals and the constant signal die terminals 72.

Figure 10B:
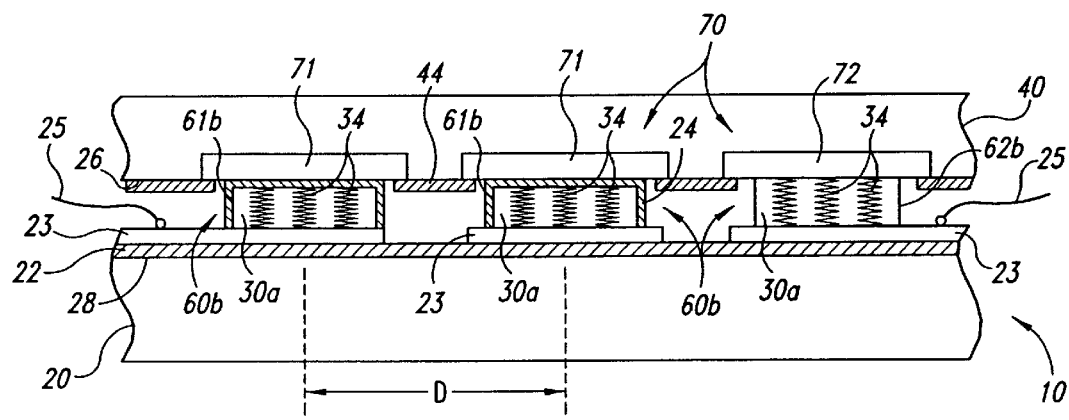
FIG. 10B is an exploded cross-sectional view of the portion of the test apparatus shown in FIG. 10A having compressible test terminals in a compressed state.

In operation, the die 40 is compressed against the substrate 20 so as to compress the projections 30a, creating conductive paths from the conductive layers 23 through the projections, as shown in FIGS. 10b. The variable signal test terminals 61 form capacitive connections with the variable signal die terminals 71 and the constant signal terminals form conductive connections with the constant signal die terminals 72, as discussed previously with respect to FIGS. 1–3.

An advantage of the test apparatus shown in FIGS. 10A and 10B is that the compressible test terminals 60b flex in a vertical direction when the die 40 is engaged with the substrate 20. The test terminals 60b accordingly maintain an electrical coupling with the die terminals 70 of the die 40 even if the lower surface 26 of the die is not parallel with the upper surface 28 of the substrate. A further advantage is that the compressible constant signal test terminals 62b are biased toward the corresponding constant signal die terminals 72, increasing the likelihood of a good conductive connection therebetween and eliminating the need for serrations on the constant signal test terminals.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for testing a semiconductor die having first and second die terminals, the method comprising:
providing a test apparatus having first and second test terminals and a layer of dielectric material other than a native oxide material attached to the first test terminal, the first and second test terminals being alignable with the first and second die terminals, respectively, the layer of dielectric material having a thickness that permits the first test terminal to be capacitively coupled with the first die terminal so that a test signal is transmitted therebetween;
aligning the first test terminal with the first die terminal and the second test terminal with the second die terminal;
capacitively coupling the test signal from the first test terminal to the first die terminal; and
varying a temperature of the die and test apparatus to vary a size of the die and a size of the test apparatus.

2. The method of claim 1 wherein providing a test apparatus having first and second test terminals and a layer of dielectric material other than a native oxide material attached to the first test terminal comprises providing a test apparatus having first and second test terminals and a layer of a nitride material attached to the first test terminal.

3. The method of claim 1 wherein providing a test apparatus having first and second test terminals and a layer of dielectric material other than a native oxide material attached to the first test terminal comprises providing a test apparatus having first and second test terminals and a layer of oxide material attached to the first test terminal.

4. The method of claim 1, further comprising maintaining alignment between the first test terminal and the first die terminal and between the second test terminal and the second die terminal as the temperature of the die and test apparatus are varied.

5. The method of claim 1 wherein providing a test apparatus comprises providing a test apparatus having a substrate comprising a silicon material.

6. The method of claim 1 wherein providing a test apparatus comprises providing a test apparatus having a substrate comprising a ceramic material.

7. The method of claim 1 wherein capacitively coupling the test signal from the first test terminal to the first die terminal comprises capacitively coupling a variable signal from the first test terminal to the first die terminal.

8. A method of testing a semiconductor die having first and second die terminals, the method comprising:
providing a test apparatus having first and second test terminals and a layer of dielectric material other than a native oxide material proximate the first test terminal, the first and second test terminals being alignable with the first and second die terminals, respectively, the layer of dielectric material being intermediate the first test terminal and the first die terminal and having a thickness that permits the first test terminal to be capacitively coupled with the first die terminal so that a test signal is transmitted therebetween;
aligning the first test terminal with the first die terminal and the second test terminal with the second die terminal; and
capacitively coupling the test signal from the first test terminal to the first die terminal.

9. The method of claim 8 wherein providing a test apparatus having first and second test terminals and a layer of dielectric material other than a native oxide material proximate the first test terminal comprises providing a test apparatus having first and second test terminals and a layer of a nitride material proximate the first test terminal.

10. The method of claim 8 wherein providing a test apparatus having first and second test terminals and a layer of dielectric material other than a native oxide material proximate the first test terminal comprises providing a test apparatus having first and second test terminals and a layer of an oxide material proximate the first test terminal.

11. The method of claim 8, further comprising receiving an output signal from the die.

12. The method of claim 8 wherein providing a test apparatus comprises providing a test apparatus having a substrate comprising a silicon material.

13. The method of claim 8 wherein providing a test apparatus comprises providing a test apparatus having a substrate comprising a ceramic material.

14. The method of claim 8 wherein capacitively coupling the test signal from the first test terminal to the first die terminal comprises capacitively coupling a variable signal from the first test terminal to the first die terminal.

15. The method of claim 8, further comprising varying a temperature of the die and test apparatus.

16. The method of claim 8, further comprising coupling the second test terminal to a source of constant power.

17. The method of claim 8, further comprising capacitively coupling the second test terminal with the second die terminal.

18. The method of claim 8, further comprising releasably biasing the die into engagement with the test apparatus.

19. A method of testing a semiconductor die having first and second die terminals, the method comprising:

providing a test apparatus having a substrate, first and second conductive projections extending away from the substrate and alignable with the first and second die terminals, respectively, the test apparatus including a portion of a dielectric material other than a native oxide material attached to the first projection and positioned intermediate the first projection and the first die terminal when the first projection is aligned with the first die terminal, the portion of dielectric material having a thickness that permits the first projection to be capacitively coupled with the first die terminal so that a test signal is transmitted therebetween;

aligning the first conductive projection with the first die terminal and the second conductive projection with the second die terminal; and capacitively coupling the test signal from the first conductive projection to the first die terminal.

20. The method of claim 19 wherein providing a test apparatus including a portion of a dielectric material other than a native oxide material comprises providing a test apparatus including a portion of a nitride material.

21. The method of claim 19 wherein providing a test apparatus including a portion of a dielectric material other than a native oxide material comprises providing a test apparatus including a portion of an oxide material.

22. The method of claim 19 wherein providing a test apparatus having a substrate comprises providing a test apparatus having a silicon substrate.

23. The method of claim 19 wherein providing a test apparatus having a substrate comprises providing a test apparatus having a ceramic substrate.

24. The method of claim 19 wherein capacitively coupling the test signal from the first conductive projection to the first die terminal comprises capacitively coupling a variable signal from the first conductive projection to the first die terminal.

* * * * *

UNITED STATES PATENT AND TRADEMARK OFFICE
CERTIFICATE OF CORRECTION

PATENT NO. : 6,369,597 B2
DATED : April 9, 2002
INVENTOR(S) : Warren M. Farnworth and Salman Akram It is certified that error appears in the above-identified patent and that said Letters Patent is hereby corrected as shown below:

Column 14,
Line 12, reads "of oxide" should read -- of an oxide --

Signed and Sealed this

Seventeenth Day of September, 2002

Attest:

Attesting Officer

JAMES E. ROGAN
Director of the United States Patent and Trademark Office